United States Patent
Moitzi et al.

(10) Patent No.: US 12,402,258 B2
(45) Date of Patent: Aug. 26, 2025

(54) DIRECT RESIN EMBEDDING

(71) Applicant: AT&S Austria Technologie & Systemtechnik AG, Leoben (AT)

(72) Inventors: Ewald Moitzi, Zeltweg (AT); Friedrich Beller, Leoben (AT); Thomas Kristl, Trofaiach (AT)

(73) Assignee: AT&S Austria Technologie & Systemtechnik AG, Leoben (AT)

( * ) Notice: Subject to any disclaimer, the term of this patent is extended or adjusted under 35 U.S.C. 154(b) by 289 days.

(21) Appl. No.: 18/183,892

(22) Filed: Mar. 14, 2023

(65) Prior Publication Data

US 2023/0300992 A1    Sep. 21, 2023

(30) Foreign Application Priority Data

Mar. 21, 2022  (EP) .................................... 22163357

(51) Int. Cl.
| | |
|---|---|
| H05K 3/46 | (2006.01) |
| H01L 21/56 | (2006.01) |
| H01L 23/31 | (2006.01) |
| H05K 1/18 | (2006.01) |

(52) U.S. Cl.
CPC ........... *H05K 3/4644* (2013.01); *H01L 21/56* (2013.01); *H01L 23/3121* (2013.01); *H05K 1/185* (2013.01); *H05K 2203/1105* (2013.01); *H05K 2203/1322* (2013.01)

(58) Field of Classification Search
CPC ........................... H05K 3/4644; H01L 23/3121
USPC .......................................................... 361/761
See application file for complete search history.

(56) References Cited

U.S. PATENT DOCUMENTS

| | | | |
|---|---|---|---|
| 2009/0084596 A1* | 4/2009 | Inoue | H01L 24/24 |
| | | | 29/846 |
| 2014/0177192 A1 | 6/2014 | Lee et al. | |
| 2016/0113114 A1* | 4/2016 | Chan | H05K 3/0097 |
| | | | 174/251 |
| 2018/0288879 A1 | 10/2018 | Tuominen | |
| 2020/0176346 A1* | 6/2020 | Wu | H01L 25/18 |

FOREIGN PATENT DOCUMENTS

| | | |
|---|---|---|
| EP | 3474639 A1 | 4/2019 |
| EP | 3481162 A1 | 5/2019 |
| EP | 3478037 B1 | 3/2020 |
| JP | 2009081423 A | 4/2009 |
| JP | 2015002295 A | 1/2015 |
| KR | 101534861 B1 | 7/2015 |
| WO | 2012005394 A1 | 1/2012 |

OTHER PUBLICATIONS

Tomezak, A.; Extended European Search Report in Application No. 22163357.1; pp. 1-8; Sep. 15, 2022; European Patent Office; 80298. Munich, Germany.

* cited by examiner

*Primary Examiner* — Andargie M Aychillhum
(74) *Attorney, Agent, or Firm* — Robert A. Blaha; Smith Tempel Blaha LLC

(57) ABSTRACT

A method of manufacturing a component carrier includes providing a core structure with at least one electrically insulating layer structure with a through hole, closing the through hole by a resin layer, and attaching a component in the through hole to the resin layer. The component is fixed to the core structure by curing the resin layer.

13 Claims, 4 Drawing Sheets

DIRECT RESIN EMBEDDING

CROSS-REFERENCE TO RELATED APPLICATIONS

This application claims the benefit of the filing date of European Patent Application No. 22163357.1, filed on Mar. 21, 2022, the disclosure of which is hereby incorporated herein by reference.

TECHNICAL FIELD

Embodiments disclosed herein relate to a method of manufacturing a component carrier and the respectively manufactured component carrier.

BACKGROUND ART

A component carrier, such as a printed circuit board (PCB) or a substrate, mechanically supports and electrically connects active and passive electronic components. Electronic components are mounted on the component carrier and are interconnected to form a working circuit or electronic assembly.

The component carrier may be manufactured by initially arranging a core structure, such as a stack, onto a temporary supporting structure. For example, a laminated tape may function as a temporary supporting structure. The temporary supporting structure may be fixed to the core structure. The core structure thereby comprises already through holes which form an accommodation space for a component which is mounted at a later stage of the manufacturing procedure. The temporary supporting structure may be fixed to the core structure by adhering the core structure to the temporary supporting structure.

In the next step, the core structure, fixed and stabilized by the temporary supporting structure, is embedded by a resin material in a lamination procedure. There, a layer of resin material is applied to the core structure and the component which are uncovered by the temporary supporting structure. Next, in a lamination step, in which pressure and heat is applied to the component carrier, the component as well as the core structure are covered and enclosed by the resin material.

After the lamination step, the temporary supporting structure is removed. Thereby residues are still sticking on contact faces and other relevant regions of the component and the core structure that were covered by the temporary supporting structure. Hence, cleaning processes, such as plasma desmear processes are necessary.

SUMMARY

There may be a need for providing simplified and more efficient manufacturing methods for manufacturing a component carrier.

According to a first aspect a method of manufacturing a component carrier is described. The method comprises the steps of providing a core structure comprising at least one electrically insulating layer structure and having a through hole. The through hole is closed by a resin layer. In a subsequent step, a component is attached in the through hole to the resin layer. The component is embedded to the core structure by curing the resin layer, wherein the resin layer may thereby form a resin shell.

According to a further aspect a component carrier, in particular manufactured by the method described above, is presented. The component carrier comprises a core structure comprising at least one electrically insulating layer structure and a component embedded in a through hole of the core structure. Furthermore, the component carrier comprises a resin layer closing the through hole, wherein a portion of the component (such as a portion of the housing of the component and/or a contact section/pad) is embedded in the resin layer, such that a resin shell is formed by the resin layer for at least partially homogeneously surrounding, as only dielectric material, at least the portion of the component.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

The core structure forms the structure supporting and, at least partially, surrounding the component. The core structure comprises the through hole, in which the component may be arranged and fixed. The through hole forms a hole being surrounded by material of the core structure. The through hole according to the present disclosure may also be formed at edge sections or corner sections of the core section and may thus form grooves being only partially surrounded by material of the core structure. Also, a plurality of through holes for accommodating a respective plurality of components may be provided in the core structure. The core structure may thus provide a mechanical support for the component. Additionally, the core structure may comprise conductive traces or layers and may provide for example a signal coupling with the component. As described below, the core structure may form a stack made of a plurality of electrically insulating and conductive layers or may be monolithically formed of a dielectric material, i.e., the electrically insulating layer structure, respectively. The core structure may be fully cured, which means that the flow behavior at elevated temperatures is hindered. Additionally and alternatively, the core material may be reinforced by additional material, e.g., glass with different shapes such as spheres or preferably fibers.

In contrast to the conventional approach, wherein the through hole is closed by a removable temporary supporting structure with, e.g., adhesive properties, according to the present disclosure the through hole is closed by a non-removable resin layer which is coupled and fixed to the core structure, e.g., in a lamination process and which functions as a protective and supporting resin shell in the final manufactured component carrier. The resin layer and the core structure may be laminated in a heatable press, e.g., a Short-cycle Lamination System (SLS). As described below in more detail, the resin layer may be attached to the core structure in an uncured or partially cured material state. The resin layer may be made of fiber free or fiber reinforced material (such as a prepreg). Hence, according to a further exemplary embodiment of the component carrier, the resin layer consists of pure resin, in particular is free of reinforcing fibers.

After closing the through hole by the resin layer, the component is attached in the through hole to the resin layer. Specifically, the component is exactly aligned within the through hole and fixable to the resin layer. Hence, by fixing the component to the resin layer, the risk of misalignment of the component inside the through hole during subsequent manufacturing steps is reduced. The component is fixed to the resin layer by (further) curing the resin layer. Hence, heat and optionally pressure is applied to the component carrier, i.e., the resin layer and the component, such that the resin layer partially embeds and engages parts of the component, such as part of the housing or a part of other items of the component, such as protruding pads. Thereby, also the risk that gas or air bubble inclusion occur inside the resin material, at the surface to said component's housing and/or at the protruding pads is reduced. For example, protruding pads may be patterned or they may consist of a continuous monolithic portion and non-patterned portion which is engaged with the resin layer. When the resin layer is cured, a robust fixation and engagement of the component with the cured resin layer exists.

Hence, by the approach of the present disclosure, the resin layer forms a stabilizing layer of the final component carrier and functions as a permanent layer of final component carrier. Thus, there is no need to provide a temporary layer during manufacturing of the component carrier so that a plurality of manufacturing steps, such as removing the temporary supporting layer and removing residues from the surface of the core structure, where the temporary supporting layer was attached, are obsolete. Thus, a more efficient manufacturing procedure for a component carrier can be provided. Furthermore, due to the fact that there is no foreign material used (e.g., the temporary support structure with adhesive surface which include, e.g., an adhesion promotor on the surface), the risk of microcracks between the component and the remaining stack during manufacturing (e.g., caused by stripping of the conventional temporary supporting structure) also during performance tests (e.g., HAST b-HAST) may be reduced. Hence, higher reliability due to less scraped parts is provided by fixing the permanent resin layer to the core structure. Furthermore, the resin layer can be formed very thin.

According to further exemplary embodiment of the present disclosure, in the step of closing the through hole, the resin layer is attached to a bottom surface of the core structure. The bottom surface of the core structure forms an exposed surface of the core surface and may be prepared for being coupled to the resin layer. Furthermore, the bottom surface of the core layer may be a surface of a dielectric layer of the core structure. In a further exemplary embodiment, the bottom surface may comprise for example an electrically conductive layer. The electrically conductive layer may be patterned. The through hole may be closed by applying heat and pressure to the resin layer. Thereby, the resin layer becomes fluent such that e.g., the patterned structure, e.g., protruding portions, of the electrically insulating layer are surrounded and embedded by the resin layer.

According to a further exemplary embodiment, the resin layer comprises a protrusion extending partially inside the through hole. Specifically, the resin layer may comprise a homogeneous flat surface from which the protrusion extends. If the resin layer is attached to the surface of the core structure, the protrusion extends into the through hole. Hence, a seat may be formed by the protrusion, onto which the component may be supported. Thereby, the position of the component within the through hole may be adjusted.

According to a further exemplary embodiment, the protrusion comprises an uncured resin when the resin layer is attached to the core structure for closing the through hole. After the resin layer is attached to the core structure, the respective lamination process is applied such that the resin layer is cured, thereby preferably forming an even surface with the bottom side of the core structure and closing the though hole partly and/or preferably completely.

According to a further exemplary embodiment, the core structure is a stack comprising at least one electrically conductive layer structure and at least one electrically insulating layer structure and having the through hole. Furthermore, according to a further exemplary embodiment, the core structure is a substrate consisting of the electrically insulating layer structure and having the through hole. The core structure may be fully cured, which means that the flow behavior at elevated temperatures is hindered. Additionally and alternatively, the core material may be reinforced by additional material e.g., glass with different shapes such as spheres or preferably fibers.

For example, the component carrier comprises the stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In the context of the present application, the term "substrate" may be formed only of the electrically insulating layer structure. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). In another embodiment, the substrate may be substantially larger than the assigned component (for instance in a flip chip ball grid array, FCBGA, configuration). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

According to a further exemplary embodiment, the component is preheated before and/or during attaching the component to the resin layer. By heating the component, the contact region of the resin layer becomes partially fluent, such that a partial engagement and hence fixation between the component in the resin layer is promoted.

Partially fluent may relate to a viscosity of e.g., 10 Pa*s to 100000 Pa*s, preferable 100 Pa*s to 10000 Pa*s. Furthermore, the polymers may be cured in a partially fluent state between 20-80%. An uncured state may be defined with a viscosity lower 10 Pa*s and/or below 20% cured polymer amount. A fully cured state may be defined with a viscosity of more than $10^6$ Pa*s and/or more than 95% cured polymer amount.

According to a further exemplary embodiment, at least a portion of the resin layer to which the component is attached is preheated before and/or during attaching the component to the resin layer. Specifically, by heating the portion of the resin layer to which the component is attached, the contact region of the resin layer becomes partially fluent, such that a partial engagement and hence fixation between the component in the resin layer is promoted.

Specifically, in the first heating step, the resin layer is heated and therefore partially fluent and the resin layer is fixed to the core structure in order to close the through hole. In a second heating step, the portion of the resin layer (e.g., the region which closes the through hole) to which the component is supposed to be attached in a subsequent attaching step, is heated. Hence, during the step of attaching the component, the section of the resin layer being fixed to the core structure stays unheated such that the fixation to the core structure is not weakened by applying heat.

According to a further exemplary embodiment, the resin layer is only partially cured when attaching the component to the resin layer by applying a pressure and/or heat. For example, the resin layer may be partially cured, wherein pressure and/or heat is applied to the resin layer for pressing the resin layer to the core structure, wherein other sections of the resin layer are not treated with pressure and/or heat. Hence, the sections of the resin layer treated with heat are cured, wherein the unheated sections are kept uncured. Especially, in the uncured sections, fixation and binding with the component may be still provided.

According to a further exemplary embodiment, the resin layer is only partially cured by preheating the resin layer. Hence, heat is applied to the resin layer for fixing the resin layer to the core structure without fully curing the resin layer. The term "partially curing" thereby defines a state of the resin layer, where the resin layer is not fully irreversibly hardened. That means, that in the state of the partially cured resin layer, upon applying further sheets, the resin layer becomes still at least partially fluent for further processing. An uncured state means that the resin consists of totally uncured/crosslinked polymers. In a partially cured/uncured state, the resin material is in a state between e.g., a 20% cured/20% crosslinked polymer state and a fully hardened/crosslinked polymer state.

Hence, the resin layer is partially cured for example for fixing the resin layer to the core structure. After fixing and attaching the component to the partially cured resin layer a final step of curing, for example by further applying heat and pressure, is conducted, in order to finally cure the resin layer irreversibly.

According to a further exemplary embodiment, the method comprises an attaching of a further resin layer to a top surface of the component and of the core structure. The top surface defines the surface of the component and/or of the core structure that forms an opposite surface with respect to the bottom surface, to which the resin layer is attached. The further resin layer may fully or partially close the through hole at an opposite opening of the through holes with respect to the opening that is closed by the resin layer. The further resin layer may be cured by applying heat and/or pressure, wherein the further resin layer becomes partially fluent and may flow inside a through hole for enveloping and embedding the component arranged in the through hole. The further resin layer may be cured after the step of curing the resin layer. In a further exemplary embodiment as described below, also a simultaneous curing of the resin layer together with the further resin layer is possible. Both, the resin layer and the further resin layer form after curing a rigid and stable resin shell embedding and engaging the component as well as the core structure. The resin shell may be free of interior dielectric interfaces between the resin layer and the further resin layer. Alternatively, in particular if the resin layer and the further resin layer are formed successively, the resin shell may have (only) one interior dielectric interface between the resin layer and the further resin layer. The resin layer and the further resin layer may be made of the same (dielectric) material or may be made of different (dielectric) material.

Specifically, in the step of curing the resin layer and/or the further resin layer, the respective resin layer becomes fluent to such an extent that material of the heated resin layer flows inside the through hole and fills specifically the space between the sidewalls of the core structure in the through hole and the sidewalls of the component. Thereby, also the risk that gas or air bubble inclusion occur inside the resin material, at the surface to said component's housing and/or at the protruding pads is reduced. For example, protruding pads may be patterned or they may consist of a continuous monolithic portion and non-patterned portion which is engaged with the resin layer.

According to a further exemplary embodiment, the resin layer and the further resin layer are simultaneously cured, in particular fully curing, for forming a resin shell. Additionally, the resin layer and the further resin layer may comprise different material or preferably the same materials.

According to a further exemplary embodiment, the method comprises a filling of lateral gaps between the core structure and the component with resin by said fully curing of the resin layer and the further resin layer for forming the resin shell. Hence, by curing the resin layer and the further resin layer simultaneously, material of the resin layer and the further resin layer flows inside a through hole and material of both resin layers is merged in the through hole. Thereby, the resin layer and the further resin layer forms a monolithically formed resin shell.

Hence, in a first heating step, the resin layer and the further resin layer are partially cured (i.e., heated and treated with pressure) for fixing the resin layer and the further resin layer to the core structure. Next, in a further heating step, the resin layer and the further resin layer are fully cured (i.e., heated and treated with pressure), wherein by fully curing the resin material of the resin layer and the further resin layer becomes fluent for flowing inside the through hole.

According to further exemplary embodiment, by filling lateral gaps between the core structure and the component with resin by said fully curing of the resin layer and the further resin layer, the resin layer and the further resin layer form an integrally formed resin shell on a bottom main surface and/or on a top main surface of the core structure. As described above, by curing the resin layer and the further resin layer, material of the resin layer and the further resin layer flows inside a through hole and material of both resin layers are merged in the through hole. Thereby, the resin layer and the further resin layer form a monolithically and integrally formed resin shell.

In a further exemplary embodiment of the component carrier, the resin layer is integrally formed with at least one patterned or continuous resin layer on a bottom main surface and/or on a top main surface of the core structure.

According to a further exemplary embodiment, the resin layer is penetrated by only one or more electrically conductive through connections electrically coupling the component with the at least one further electrically conductive layer structure and/or with an electronic periphery of the component carrier. For example, the resin layer may cover the complete surface of the attached component. In order to connect the pads of the component, the electrically conductive through connections are formed through the resin layer for providing an electrical signal interface with the component and the environment. The electrically conductive through connections may be formed by etching or by mechanical drilling and a subsequent filling (e.g., plating) with conductive material.

According to an exemplary embodiment of the component carrier, the resin shell is penetrated by only one or more electrically conductive through connections electrically coupling the component with the at least one further electrically conductive layer structure and/or with an electronic periphery of the component carrier.

According to a further exemplary embodiment, the through hole is closed by the resin layer before attaching the component in the through hole. Hence, after the through hole is closed by the resin layer, the component may be inserted from an upper side opening of the through hole and may be fixed, specifically by partially curing, to the resin layer.

According to a further exemplary embodiment, the component is attached to the resin layer before closing the through hole by the resin layer. Hence before the through hole is closed by the resin layer, the component is placed onto the surface of the resin layer at a specific section of the resin layer that is selected for closing the through hole. Hence, the resin layer may be partially cured for fixing the component to the resin layer and in the next step, the resin layer may be attached to the core structure such that the component is aligned within the through hole. In a next step, the resin layer is fully cured such that a final fixation of the resin layer to the core structure is provided.

According to further exemplary embodiment, the resin layer is attached to a support frame before attaching the component to the resin layer. The support frame forms a stable basis to which the core layer may be attached without causing deformation of the resin layer before being attached to the core structure. Hence, misalignment of the resin layer with respect to the core structure may be prevented. The support frame is temporally attached to the resin layer. After partially or fully curing the resin layer, the support frame may be removed. The support frame may have a platelike shape for providing a full surface contact with the resin layer. Alternatively, the support frame may comprise a window/opening, such that the support frame supports the resin layer only at edges of the resin layer.

According to further exemplary embodiment, the component comprises at least one pad being formed on a main surface of the component. The main surface is closest to the resin layer. The thickness of the resin layer is larger or equal with respect to the height of the at least one pad, such that the pad is completely inside the resin layer. In other words, the resin layer fully covers and embeds the pads of the component. Alternatively, the thickness of the resin layer is smaller with respect to the height of the at least one pad, such that after the curing of the resin layer, the pads protrude through the resin layer. The pads comprise conductive material, such as copper, and may comprise a rough surface to improve the adhesion in the resin layer. However, embedding of the component could also be done without pad (copper) portions on the bottom side of the component. For example, a bottom area of the component may consist of all-over flat copper areas.

According to an exemplary embodiment the at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs), indium phosphide (InP) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the at least one electrically conductive layer structure comprises at least one of the group consisting of copper, aluminum, nickel, silver, gold, palladium, tungsten, magnesium, carbon, (in particular doped) silicon, titanium, and platinum. Although copper is usually preferred, other materials or coated versions thereof are possible as well, in particular materials coated with supra-conductive material or conductive polymers, such as graphene or poly (3,4-ethylenedioxythiophene) (PEDOT), respectively.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g., based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties e.g., FR4 or FR5, which describe their flame-retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

The aspects defined above and further aspects of the present disclosure are apparent from the examples of embodiment to be described hereinafter and are explained with reference to the examples of embodiment. The disclosure will be described in more detail hereinafter with reference to examples of embodiment but to which the disclosure is not limited.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), Electroless Nickel Electroless Palladium Immersion Gold (ENEPIG), gold (in particular hard gold), chemical tin (chemical and electroplated), nickel-gold, nickel-palladium, etc. Also nickel-free materials for a surface finish may be used, in particular for high-speed applications. Examples are ISIG (Immersion Silver Immersion Gold), and EPAG (Electroless Palladium Autocatalytic Gold).

The aspects defined above and further aspects of the disclosure are apparent from the examples of embodiment to be described hereinafter and are explained with reference to these examples of embodiment.

DETAILED DESCRIPTION OF ILLUSTRATED EMBODIMENTS

Figure 1:
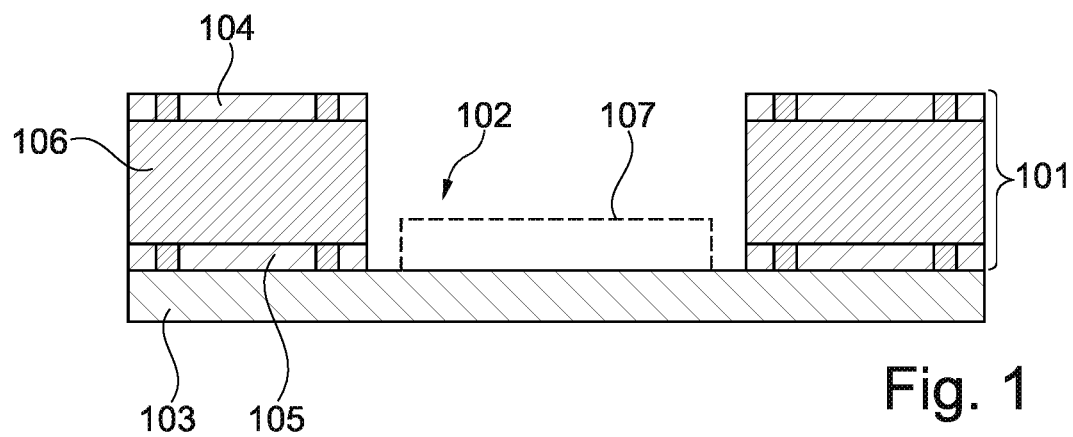
FIG. 1, FIG. 2, and FIG. 3 show schematic views of manufacturing a component carrier according to an exemplary embodiment of the present disclosure.

The illustrations in the drawings are schematically presented. It is noted that in different figures, similar or identical elements or features are provided with the same reference signs or with reference signs, which are different from the corresponding reference signs only within the first digit. In order to avoid unnecessary repetitions elements or features which have already been elucidated with respect to a previously described embodiment are not elucidated again at a later position of the description.

Further, spatially relative terms, such as "front" and "back", "above" and "below", "left" and "right", et cetera are used to describe an element's relationship to another element(s) as illustrated in the figures. Thus, the spatially relative terms may apply to orientations in use which differ from the orientation depicted in the figures. Obviously, all such spatially relative terms refer to the orientation shown in the figures only for ease of description and are not necessarily limiting as an apparatus according to an embodiment of the disclosure can assume orientations different than those illustrated in the figures when in use.

Figure 2:
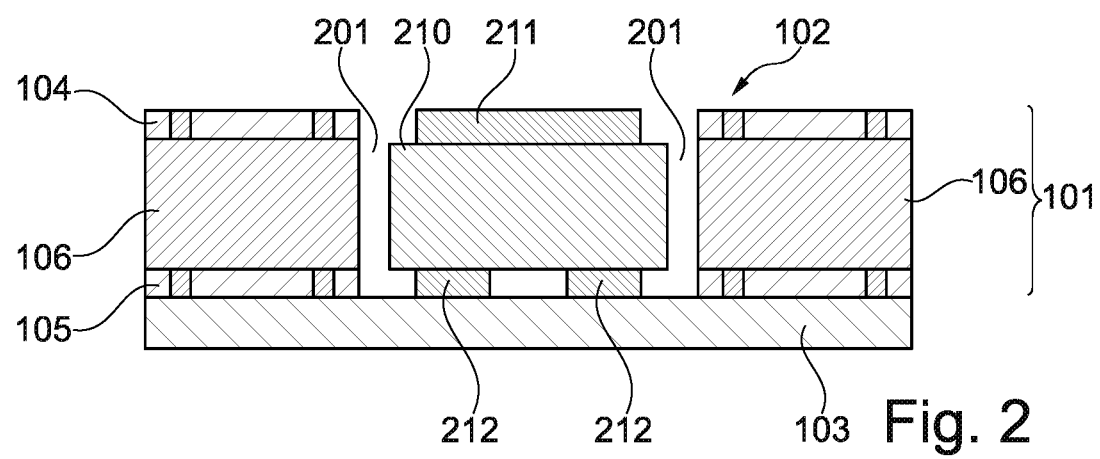
Figure 3:
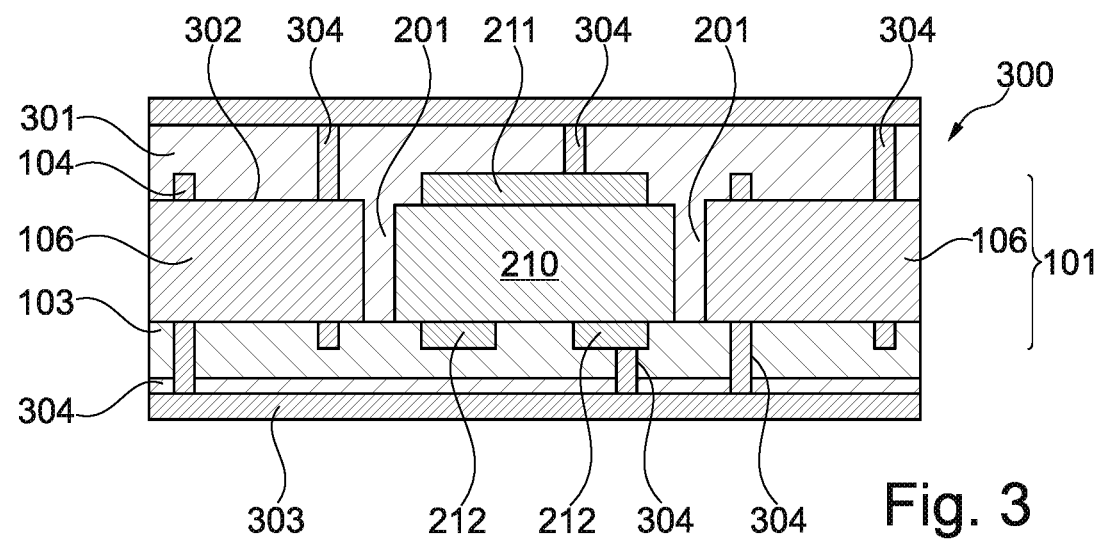

FIG. 1, FIG. 2, and FIG. 3 show schematic views of manufacturing a component carrier according to an exemplary embodiment of the present disclosure. The core structure 101 forms the structure supporting and, at least partially, surrounding the component 210. The core structure 101 comprises the through hole 102, in which the component 210 is later arranged and fixed. The core structure 101 provides a mechanical support for the component 210. Additionally, the core structure 101 comprises conductive traces or layers 104, 105 for providing a signal coupling with the component 210. The core structure 101 may form a stack made of one or a plurality of electrically insulating layers 106 and conductive layers 104, 105.

In FIG. 1, a core structure 101 is provided comprising at least one electrically insulating layer structure 106 and having a through hole 102. As shown in FIG. 2, the through hole 102 is closed by a resin layer 103. A component 210 is attached in the through hole 102 to the resin layer 103. Furthermore, the component 210 is attached to the core structure 101 via the fully or partially cured resin layer 103 that is fixed to the core structure 101. The through hole 102 is closed by the non-removable resin layer 103 which is coupled and fixed to the core structure 101, e.g., in a lamination process and which functions as a protective and supporting resin shell in the final manufactured component carrier. The resin layer 103 is attached to the core structure 101 in an uncured or partially cured material state.

The core structure 101 comprises a central electrically insulating layer 106 or a stack made of a plurality of electrically conductive and electrically insulating layers, wherein one electrically conductive layer 104 forms a top surface of the core structure 101 and one electrically conductive layer 105 forms a bottom surface of the core structure 101.

In the step of closing the through hole 102, the resin layer 103 is attached to a bottom surface of the core structure 101. The bottom surface of the core structure 101 forms an exposed surface of the core structure 101 and may be prepared for being coupled to the resin layer 103. The bottom surface may comprise for example an electrically conductive layer 105. The electrically conductive layer 105 may be patterned. The through hole 102 may be closed by applying heat and pressure to the resin layer 103. Thereby, the resin layer 103 becomes fluent such that e.g., the patterned structure, e.g., protruding portions, of the electrically insulating layer 105 are surrounded and embedded by the resin layer 103.

As shown with the dotted lines in FIG. 1, the resin layer 103 may comprise a protrusion 107 extending partially inside the through hole 102. Specifically, the resin layer 103 may comprise a homogeneous flat surface from which the protrusion 107 extends. If the resin layer 103 is attached to the surface of the core structure 101, the protrusion 107 extends into the through hole 102. Hence, the component may be supported by the protrusion 107.

The protrusion 107 comprises an uncured or partially cured resin when the resin layer is attached to the core structure for closing the through hole. After the resin layer is attached to the core structure, the respective lamination process is applied such that the resin layer is cured by heat and pressure.

As shown in FIG. 2, after closing the through hole 102 by the resin layer 103, the component 210 is attached in the through hole 102 to the resin layer 103. Specifically, the component 210 is exactly aligned within the through hole 102 and fixed to the resin layer 103.

As shown in FIG. 3 a further resin layer 301 is attached to a top surface of the component 210 and of the core structure 101. The top surface defines the surface of the component 210 and of the core structure 101 that forms an opposite surface with respect to the bottom surface, to which the resin layer 103 is attached. The further resin layer 301 may fully or partially close the through hole 102 at an opposite opening of the through holes 102 with respect to the opening that is closed by the resin layer 103. The further resin layer 301 may be cured by applying heat and pressure, wherein the further resin layer 301 becomes at least partially fluent and flows inside a through hole 102 for, at least partially or fully enveloping and embedding the component 210 arranged in the through hole 102, thereby preferably completely closing the lateral gap between the component 210 and the core structure 101. The further resin layer 301 may be cured simultaneously or after the step of curing the resin layer 103. Both, the resin layer 103 and the further resin layer 301 form after curing a rigid and stable resin shell embedding and engaging the component 301 as well as the core structure 101. In the step of curing the resin layer 103 and/or the further resin layer 301, the respective resin layer 103 becomes fluent to such an extent that material of the heated resin layer 103, 301 flows into the through hole 102 and fills specifically the gaps 201 between the sidewalls of the core structure 101 in the through hole 102 and the sidewalls of the component 210. Specifically, by curing the resin layer 103 and the further resin layer 301 simultaneously, material of the resin layer 103 and the further resin layer 301 flows inside the through hole 102 and material of both resin layers 103, 301 are merged in the through hole. Thereby, the resin layer 103 and the further resin layer 301 forms a monolithically formed resin shell in the component carrier 300.

For example, in a first heating step, the resin layer 301 and the further resin layer 103 are partially cured (i.e., heated and treated with pressure) for fixing the resin layers 103, 301 to the core structure 101. Next, in a further heating step, the resin layer 103 and the further resin layer 301 are fully cured (i.e., heated and treated with pressure), wherein by fully curing the resin material of the resin layer 103 and the further resin layer 301 becomes fluent for flowing inside the through hole 102. Hence, by (fully) curing of the resin layer 103 and the further resin layer 301, the resin layer 103 and the further resin layer 301 form an integrally formed resin shell on a bottom main surface and/or on a top main surface of the core structure 101.

The component carrier and hence the core structure 101 may have a sheet (or plate) like design comprising two opposing main surfaces. The main surfaces may form the two largest surface areas of the component carrier. The main surfaces are connected by circumferential side walls. The thickness of a component carrier is defined by the distance between the two opposing main surfaces. The main surfaces may comprise functional sections, such as conductive traces or conductive interconnections with further elements, such as one or more integrated circuits (ICs).

Further electrically conductive layer structures 302, 303 may be laminated onto the resin layers 103, 301. Furthermore, the resin layer 103 and/or the further resin layer 301 are penetrated by electrically conductive through connections 304 electrically coupling the component 210 with the at least one further electrically conductive layer structure 302, 303 and/or with an electronic periphery of the component carrier. For example, the resin layer 103, 301 may cover the complete surface of the attached component 210. In order to connect the pads 211, 212 of the component 210, the electrically conductive through connections 304 are formed through the resin layer 103, 301 for providing an electrical signal interface with the component 210 and the environment. The electrically conductive through connections 304 may be formed by etching or by mechanical and/or laser drilling and a subsequent filling (e.g., plating) with conductive material.

Figure 4:
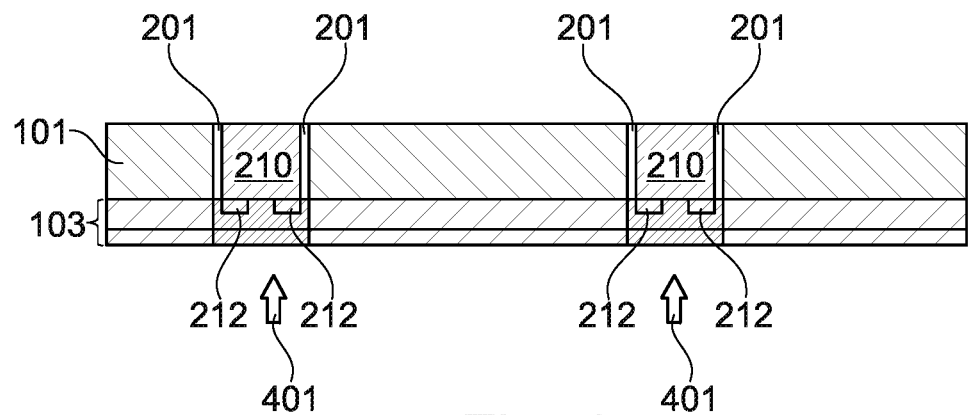
FIG. 4 shows a schematic view of a component carrier, wherein heat is applied to sections of the resin layer according to an exemplary embodiment of the present disclosure.

FIG. 4 shows a schematic view of a component carrier, wherein heat is applied to sections of the resin layer 103 according to an exemplary embodiment of the present disclosure. At least a portion of the resin layer 103 to which the component 210 is attached is preheated before and/or during attaching the component 210 to the resin layer 103. Specifically, by heating the portion of the resin layer 103 to which the component 210 is attached, the contact region of the resin layer 103 becomes partially fluent, such that a partial engagement and hence fixation between the component 210 in the resin layer 103 is promoted.

First, the resin layer 103 is heated and therefore partially fluent and the resin layer 103 is fixed to the core structure 101 in order to close the through hole 102. In a second heating step 401, the portion of the resin layer 103 (e.g., the region which closes the through hole 102) to which the component 210 is supposed to be attached in a subsequent attaching step, is heated. Hence, during the step of attaching the component 210, the section of the resin layer 103 being fixed to the core structure 101 stays unheated such that the fixation to the core structure 101 is not weakened by applying heat.

Specifically, the resin layer 103 is only partially cured when preheating the resin layer 103. Hence, heat is applied to the resin layer 103 for fixing the resin layer to the core structure 101 without fully curing the resin layer 103. After fixing and attaching the component 210 to the partially cured resin layer 103 a final step of curing, for example by further applying heat and pressure, is conducted, in order to finally cure the resin layer. In the finally curing step, the resin becomes fluent and may flow in the gaps 201 between the component 210 and the sidewalls of the core structure 101.

Figure 5:
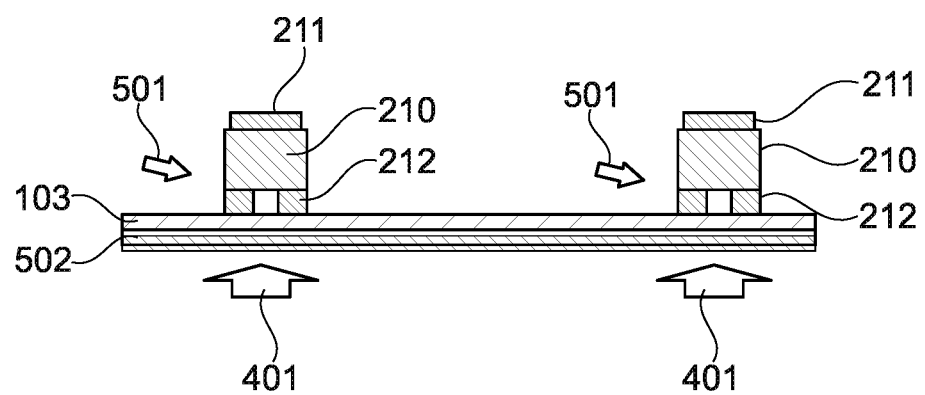
FIG. 5 shows a schematic view of a component carrier, wherein heat is applied to a component and to sections of the resin layer according to an exemplary embodiment of the present disclosure.

FIG. 5 shows a schematic view of a component carrier, wherein heat is applied to a component 210 and to sections of the resin layer 103 according to an exemplary embodiment of the present disclosure. The component 210 is preheated in step 501 before and/or during attaching the component 210 to the resin layer 103. By heating the component 210, the contact region of the resin layer 103 becomes partially fluent, such that a partial engagement and hence fixation between the component 210 in the resin layer 103 is promoted.

As shown in FIG. 5, the component 210 may be attached to the resin layer 103 before attaching the resin layer 103 to the core structure 101 and hence before closing the through hole 102 by the resin layer 103. Hence, the component 210 is placed onto the surface of the resin layer 103 at a specific section of the resin layer 103 which section is selected for closing the through hole 102. Hence, the resin layer 103 may be partially cured for fixing the component 210 to the resin layer 103 and in the next step, the resin layer 103 may be attached to the core structure 101 such that the component is aligned within the through hole 102. Next, the resin layer 103 is fully cured such that a final fixation of the resin layer 103 to the core structure 101 is provided.

The resin layer 103 may also be attached to a support frame 502 before attaching the component 210 to the resin layer 103. The support frame 502 forms a stable basis to which the core layer 103 may be attached without causing deformation of the resin layer 103 before being attached to the core structure 101. The support frame 502 is temporally attached to the resin layer 103. After partially or fully curing of the resin layer 103, the support frame 502 may be removed. Furthermore, the support frame 502 may be heated together with the resin layer 103 in a heating step 401.

Figure 6:
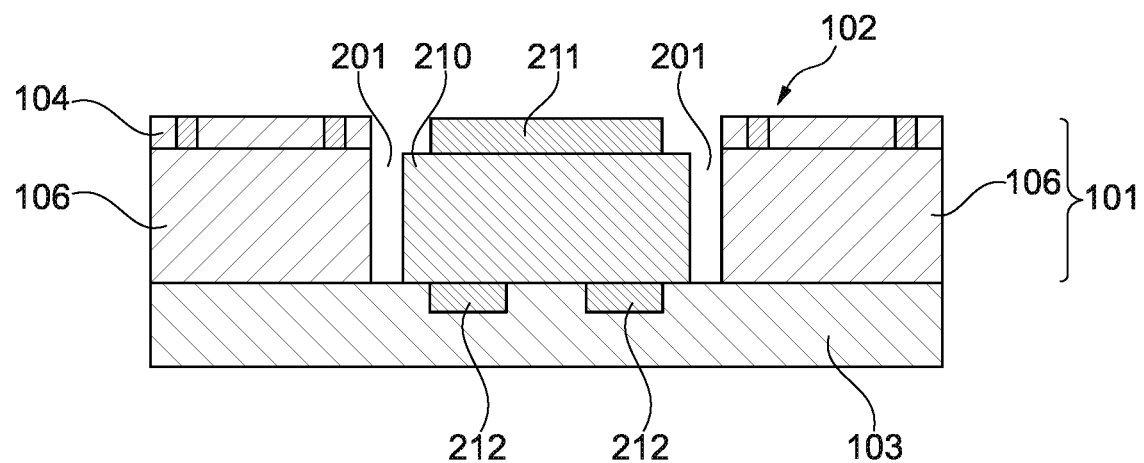
FIG. 6 shows a schematic view of a component carrier, wherein the resin layer is directly fixed to an electrically insulating core structure according to an exemplary embodiment of the present disclosure.

FIG. 6 shows a schematic view of a component carrier similar to the component carrier illustrated in FIG. 2. In contrast to the embodiment shown in FIG. 2, the resin layer 103 is directly fixed to an electrically insulating core structure 101. In the step of closing the through hole 102, the resin layer 103 is attached directly to a bottom surface of the core structure 101. The bottom surface of the core structure 101 forms an exposed surface of the core surface 101 and may be prepared for being coupled to the resin layer 103. The bottom surface of the core structure 101 may be a surface of a dielectric layer 106 of the core structure 101. However, the lower pads 212 of the component 210 may extend from the bottom surface of the core structure 101 and may therefore be embedded in the cured or partially cured material of the resin layer 103.

Figure 7:
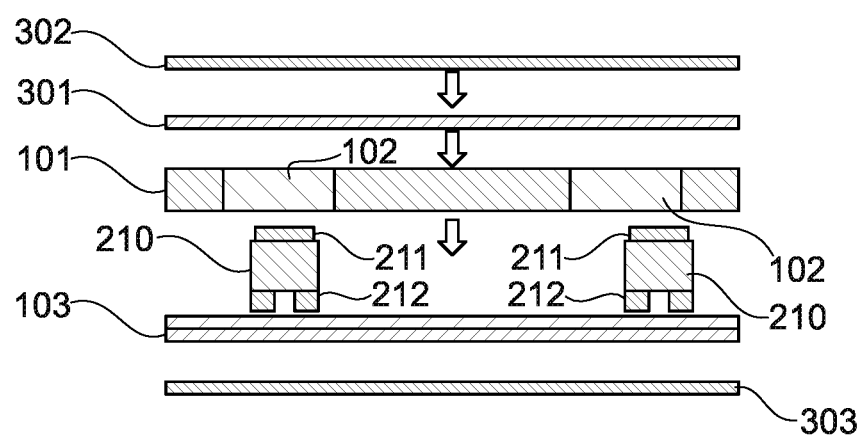
FIG. 7 shows a schematic view of several layers of the component carrier according to an exemplary embodiment of the present disclosure.

FIG. 7 shows a schematic view of several layers of the component carrier according to an exemplary embodiment of the present disclosure. In the shown example, the components 210 are fixed to the resin layer 103 (e.g., a resin material and/or a prepreg). The resin layer 103 together with the components 210 are fixed to the core structure 101 for closing the respective through holes 102 and for placing the components 210 inside the through holes 102. At the top surface of the core structure 101, a further resin layer 301 is attached. On the outer sides of the resin layers 103, 301, respective upper and lower further electrically conductive layers 302, 303 (such as copper foils) are attached. The resin layer 103 may be partially cured in order to fix the components 210 to the resin layer 103. For example, after all above-described layers are attached together, a final curing and lamination step may be applied. Thus, the layer structure shown in FIG. 7 is heated and all layers are pressed together in order to fully cure the resin layers 103, 301 to provide a robust component carrier. As can be taken from FIG. 7, the step of detaching temporary supporting layers, such as a stripping off a supporting tape, is not necessary, since the resin layers 103, 301 form permanent structures in the final component carrier.

Figure 8:
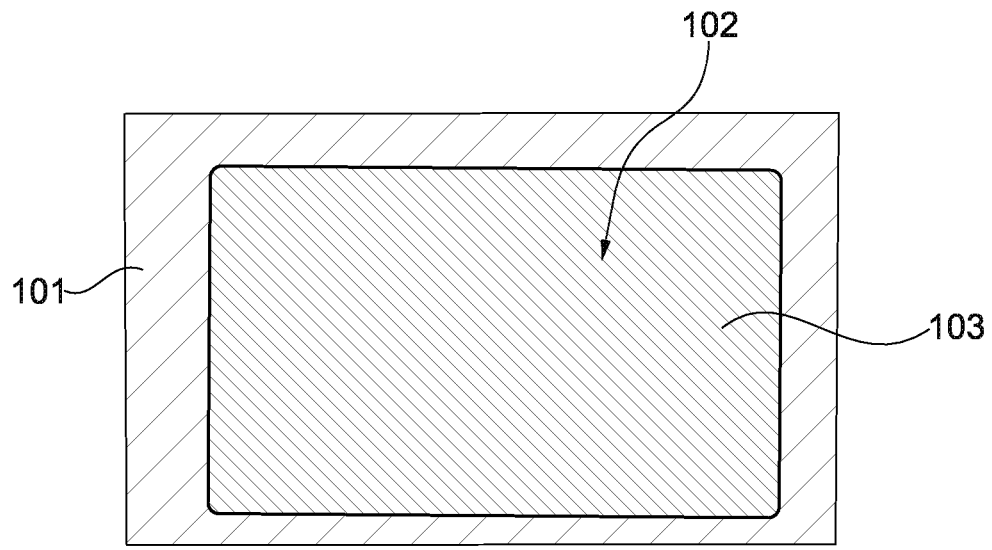
FIG. 8 shows a top view of the core structure comprising the through hole, which is closed by the resin layer, according to an exemplary embodiment of the present disclosure.

FIG. 8 shows a top view of the core structure 101 comprising the through hole 102 which is closed by the resin layer 103 by a lamination step.

Figure 9:
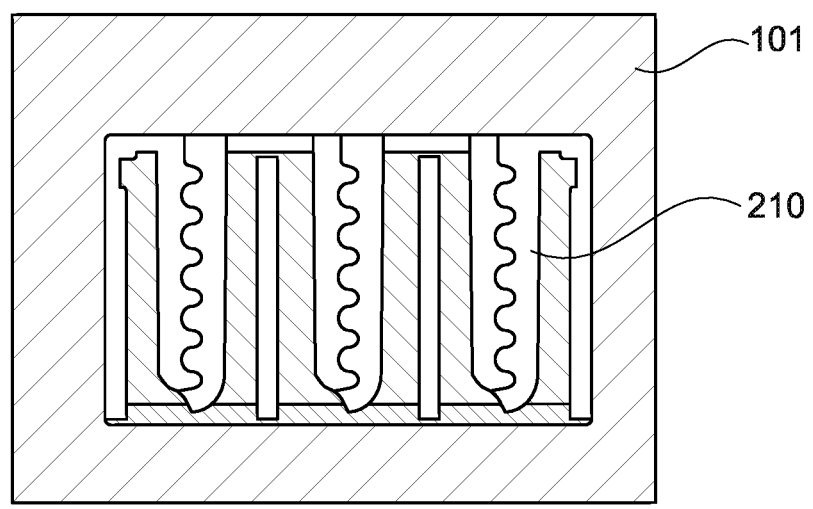
FIG. 9 shows a top view of the core structure shown in FIG. 8, wherein a component is arranged in the through hole, according to an exemplary embodiment of the present disclosure.

FIG. 9 shows a top view of the core structure 101 shown in FIG. 8, wherein a component 210 is arranged in the through hole 102. The resin layer 103, the component 210 and the core structure 101 may be further laminated in a heatable press, e.g., a Short-cycle Lamination System (SLS).

It should be noted that the term "comprising" does not exclude other elements or steps and the article "a" or "an" does not exclude a plurality. Also, elements described in association with different embodiments may be combined.

Implementation of the disclosure is not limited to the preferred embodiments shown in the figures and described above. Instead, a multiplicity of variants is possible which variants use the solutions shown and the principle according to the disclosure even in the case of fundamentally different embodiments.

REFERENCE SIGNS 101 core structure
102 through hole
103 resin layer
104 electrically conductive layer
105 electrically conductive layer
106 electrically insulating layer
107 protrusion
201 gap
210 component
211 upper pad/contact section
212 lower pad/contact section
300 component carrier
301 further resin layer
302 upper further electrically conductive layer
303 lower further electrically conductive layer
304 electrically conductive through connections
401 heat applied to resin layer
501 heat applied to the component
502 support frame

The invention claimed is:

1. A method of manufacturing a component carrier, the method comprising:
   providing a core structure comprising at least one electrically insulating layer structure and having a through hole;
   closing the through hole by a resin layer;
   attaching a component in the through hole to the resin layer; and
   fixing the component to the core structure by curing the resin layer;
   attaching a further resin layer to a top surface of the component and of the core structure, and
   simultaneously curing the resin layer and the further resin layer for forming a resin shell, so that the resin layer and the further resin layer flow inside the through hole and merge together inside the through hole.

2. The method according to claim 1,
   wherein in the step of closing the through hole, the resin layer is attached to a bottom surface of the core structure.

3. The method according to claim 1,
   wherein the resin layer comprises a protrusion extending partially inside the through hole,
   wherein the protrusion comprises an uncured resin when the resin layer is attached to the core structure for closing the through hole.

4. The method according to claim 1,
   wherein the core structure is a stack comprising at least one electrically conductive layer structure and the at least one electrically insulating layer structure and having the through hole, and/or
   wherein the core structure is a substrate consisting of the electrically insulating layer structure.

5. The method according to claim 1, further comprising at least one of the following steps:
   preheating the component before and/or during attaching the component to the resin layer,
   preheating at least a portion of the resin layer to which the component is attached before and/or during attaching the component to the resin layer,
   only partially curing the resin layer when attaching the component to the resin layer by applying a pressure.

6. The method according to claim 1, wherein the method comprises only partially curing the resin layer when preheating the resin layer.

7. The method according to claim 1, further comprising:
   filling lateral gaps between the core structure and the component with resin by partial or fully curing of the resin layer and the further resin layer for forming the resin shell,
   wherein by filling lateral gaps between the core structure and the component with resin by said curing of the resin layer and the further resin layer, the resin layer and the further resin layer form an integrally formed resin shell on a bottom main surface and/or on a top main surface of the core structure.

8. The method according to according claim 1, further comprising:
   penetrating the resin layer by only one or more electrically conductive through connections electrically coupling the component with the at least one further electrically conductive layer structure and/or with an electronic periphery of the component carrier.

9. The method according to according to claim 1, further comprising at least one of the following steps:
   closing the through hole by the resin layer before attaching the component in the through hole,
   attaching the component to the resin layer and then closing the through hole by the resin layer.

10. The method according to claim 1, further comprising:
   attaching the resin layer to a support frame before attaching the component to the resin layer.

11. The method according to claim 1,
   wherein the component comprises at least one pad being formed on a main surface of the component, which main surface is closest to the resin layer,
   wherein the thickness of the resin layer is larger or equal with respect to the height of the at least one pad, such that the pad completely inside the resin layer.

12. A component carrier, comprising:
   a core structure comprising at least one electrically insulating layer structure;
   a component embedded in a through hole of the core structure;
   a resin layer closing the through hole, wherein a portion of the component is embedded in the resin layer, such that a resin shell is formed by the resin layer for at least partially homogeneously surrounding, as only dielectric material, at least the portion of the component;
   wherein the resin layer is integrally formed with at least one patterned or continuous resin layer on a bottom main surface and/or on a top main surface of the core structure;
   wherein the resin layer formed at the bottom main surface and the resin layer formed on the top mains surface of the core structure are partially arranged inside the through hole and are merged together inisde the through hole.

13. The component carrier according to claim 12,
   wherein the resin shell is penetrated by only one or more electrically conductive through connections electrically coupling the component with the at least one further electrically conductive layer structure and/or with an electronic periphery of the component carrier,
   wherein the resin layer consists of pure resin.

\* \* \* \* \*